United States Patent [19]

Arima et al.

[11] Patent Number: 4,924,081

[45] Date of Patent: May 8, 1990

[54] PHOTO-ELECTRIC CONVERTER HAVING OFFSET VOLTAGE CORRECTING FUNCTION

[75] Inventors: Jiro Arima; Yoshihiro Okui, both of Osaka, Japan

[73] Assignee: Minolta Camera Kabushiki Kaisha, Osaka, Japan

[21] Appl. No.: 247,364

[22] Filed: Sep. 21, 1988

[30] Foreign Application Priority Data

Sep. 22, 1987 [JP] Japan .................. 62-238193

[51] Int. Cl.⁵ .............................. H01J 40/14
[52] U.S. Cl. .................... 250/214 R; 250/214 SW
[58] Field of Search ........ 250/214 SW, 214 R, 214 A, 250/206, 207, 221, 222.1; 307/311; 340/565, 567, 527, 528; 361/139; 328/2

[56] References Cited

U.S. PATENT DOCUMENTS

| | | | |
|---|---|---|---|
| 3,584,222 | 6/1971 | Nesbitt | 250/214 SW |
| 3,820,898 | 6/1974 | Olson | 356/82 |
| 3,927,317 | 12/1975 | Liedholz | 250/214 R |
| 4,172,221 | 10/1979 | Iizuka | 250/214 A |
| 4,201,472 | 5/1980 | Maeda | 356/226 |
| 4,552,446 | 11/1985 | Suda et al. | 354/429 |
| 4,650,986 | 3/1987 | Maile | 250/214 SW |
| 4,814,602 | 3/1989 | Imura | . |

FOREIGN PATENT DOCUMENTS

| | | |
|---|---|---|
| 47-11770 | 4/1972 | Japan . |
| 51-20147 | 6/1976 | Japan . |
| 51-26218 | 8/1976 | Japan . |
| 51-120785 | 9/1976 | Japan . |
| 59-81519 | 5/1984 | Japan . |

*Primary Examiner*—David C. Nelms
*Attorney, Agent, or Firm*—Price, Gess & Ubell

[57] ABSTRACT

A photo-electric converter according to the present invention has a switching element connected between a photosensitive element and a photo-electric converting circuit and another switching element connected in parallel with the photosensitive element, and an output from the photo-electric converting circuit obtained by turning on and off the switching element is analogue-to-digital converted and arithmetically processed. Thereby an offset voltage in the photo-electric converter circuit can be corrected and an accurate output can be obtained by the photo-electric conversion.

16 Claims, 5 Drawing Sheets

F I G. 2
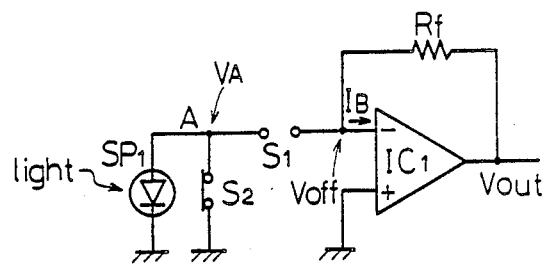
F I G. 3
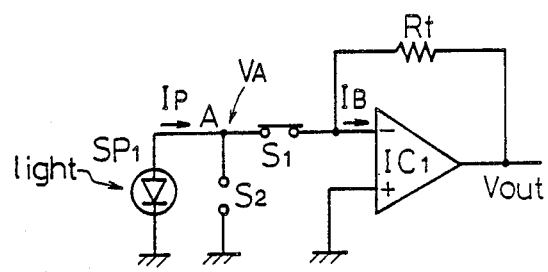
F I G. 4
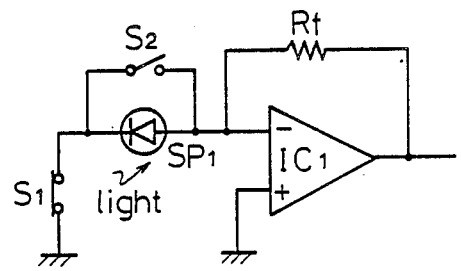

PHOTO-ELECTRIC CONVERTER HAVING OFFSET VOLTAGE CORRECTING FUNCTION

BACKGROUND OF THE INVENTION

The present invention relates to a photo-electric converter having a function of correcting an offset voltage in a photo-electric converting circuit thereof, which converts a light amount into an electric signal and is used for measuring luminous intensity and the like.

Such a kind of photo-electric converter has a photo-electric converting circuit for converting a photocurrent from a photosensitive element into a voltage or an electric current. One of the error components contained in an output from the photo-electric converting circuit is an offset voltage.

A method for correcting such an offset voltage is conventionally known which comprises putting a cap or the like on the front face of a photosensitive element to shade the same, storing the output from the photo-electric converting circuit at that time as a digital value in a CPU, and subtracting by means of the CPU the abovementioned stored digital value from a digital value representing a light measurement value (see, for example, U.S. Pat. No. 4,201,472).

Now, an offset voltage correction in a photo-electric converting circuit will be described below in detail with reference to the appended drawings, FIG. 9 shows an example of a conventional photo-electric converting circuit of a linear conversion type. The output voltage $V_{out}$ is represented by the following formula in connection with a photocurrent $I_P$ generated from a photodiode (photosensitive element) $SP_1$ when a light is thrown on the photodiode $SP_1$, a bias electric current $I_B$ and an offset voltage $V_{off}$ in an operational amplifier (photo-electric converting circuit) $IC_1$.

$$V_{out} = -(I_P - I_B)R_f + V_{off}$$

The signal component here is $$-I_P \cdot R_f$$

and the error component is $$I_B \cdot R_f + V_{off}$$

The operational amplifier $IC_1$ generally has a terminal for controlling the offset voltage to a zero value, and it is possible to make $V_{off} \simeq 0$ by means of an outer volume controller $VR_1$. However, the offset voltage depends on both temperature and power supply voltage. Accordingly, if the offset voltage is controlled to be zero in one condition, it cannot be kept zero in another condition, for example, when the temperature changes, and it must be controlled by means of the outer volume controller each time.

Further, it is impossible to eliminate the bias electric current $I_B$ to zero, and this bias electric current $I_B$ becomes a large error component in the case of measuring the photocurrent $I_P$ to a very small amount. Similarly to the offset voltage, the bias electric current depends on temperature and power supply voltage.

The examples of conventional arrangements for correcting an error caused by a offset voltage and a bias electric current are shown in FIGS. 10 and 11.

Referring now to FIG. 10, firstly a movable shading plate D is put in front of a photodiode $SP_1$ to keep the photodiode $SP_1$ from the light. At this time, the photocurrent is zero, and the output voltage $V_{out}$ is as follows.

$$V_{out} = +I_B \cdot R_f + V_{off}$$

This voltage is analogue-to-digital (hereinafter referred to as A-D) converted by means of an A-D converter 101 to obtain a corresponding digital value $N_o$, which is read and stored in a CPU 102.

Nextly, when the shading plate is moved and the light is thrown on the photodiode $SP_1$, a photocurrent $I_P$ flows and the output voltage $V_{out}$ becomes as follows.

$$V_{out} = -(I_P - I_B)R_f + V_{off}$$

This voltage is A-D converted to obtain a corresponding digital value $N'$. The CPU 102 reads the digital value $N'$ and executes the following subtraction to correct the error.

$$N = N' - N_o$$

Here, N is a digital value corresponding to $-I_P \cdot R_f$ and is displayed as a light measurement value by a display 103.

The abovementioned arrangement is disadvantageous in that a mechanism for moving the shading plate D is required and the arrangement becomes complicated and expensive.

Referring now to FIG. 11, a chopper CH to be rotatably or vibratorily driven by a motor M or the like is provided in front of a photodiode $SP_1$ so that an incident light on the photodiode $SP_1$ is converted into an AC current by the chopper CH and processed. And the output voltage $V_{out}$ is fed through a capacitor C to an amplifier 104, amplified by the amplifier 104, rectified by a rectifier 105 and displayed by a display 103.

This arrangement is disadvantageous in that a chopper and corresponding mechanism and a circuit for rotating or vibrating the chopper are required, and that when a light source such as a fluorescent light is used, the frequency of the chopper must be changed in accordance with the commercial frequency of the incident light.

SUMMARY OF THE INVENTION

An object of the present invention is to eliminate the abovementioned disadvantages of the conventional arts by providing a photo-electric converter which can correct an error caused by an offset voltage in a photo-electric converting circuit with simple arrangements and without the need of any plate or chopper for shielding a photosensitive element from a light, and corresponding mechanism and circuit for driving the plate or chopper.

In other words, according to the present invention, an error caused by an offset voltage in a photo-electric converting circuit can be corrected by arithmetically processing an output from the photo-electric converting circuit obtained by turning ON and OFF switching means connected between a photosensitive element and the photo-electric converting circuit and in parallel with the photosensitive element respectively, so that, unlike a conventional photo-electric converter, it is unnecessary to provide a chopper or the like in front of the photosensitive element and a mechanism and a circuit for driving the chopper or the like, thereby simplifying the arrangement of the photo-electric converter.

Another object of the present invention is to provide a photo-electric converter in which by short-circuiting a photosensitive element by a second switching means while the photoelectric element is separated from a photo-electric converter circuit by a first switching means, a leak current at the time of the first switching means being in OFF state can be reduced and besides, the time required for stabilization of the photo-electric converting circuit at the time of turning the first switching means from OFF to ON can be shortened.

BRIEF DESCRIPTION OF THE DRAWINGS

FIGS. 2 and 3 are circuit diagrams of a photo-electric converting circuit section of the photo-electric converter of FIG. 1;

FIG. 4 is a circuit diagram of another example of a photo-electric converting circuit section;

DETAILED DESCRIPTION OF THE PREFERRED EMBODIMENTS OF THE INVENTION

Figure 1:
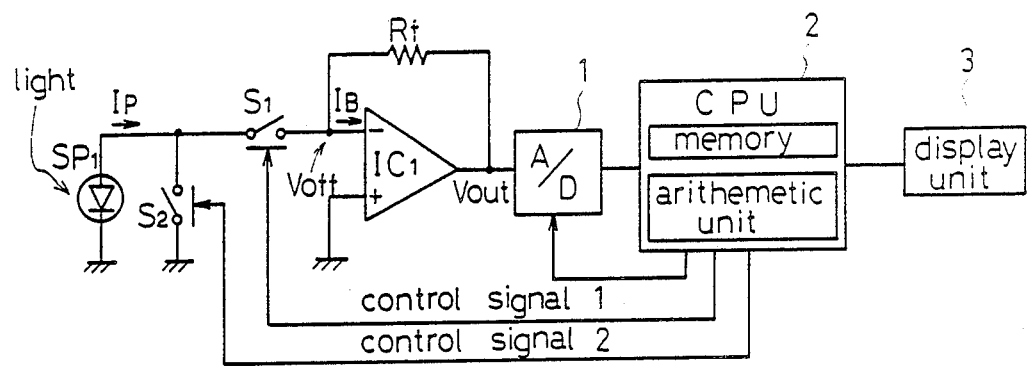
FIG. 1(a) is a block diagram of an embodiment of a photo-electric converter according to the present invention.
FIG. 1(b) is a flow chart showing the operation of the photo-electric converter of FIG. 1(a)
Figure 1:
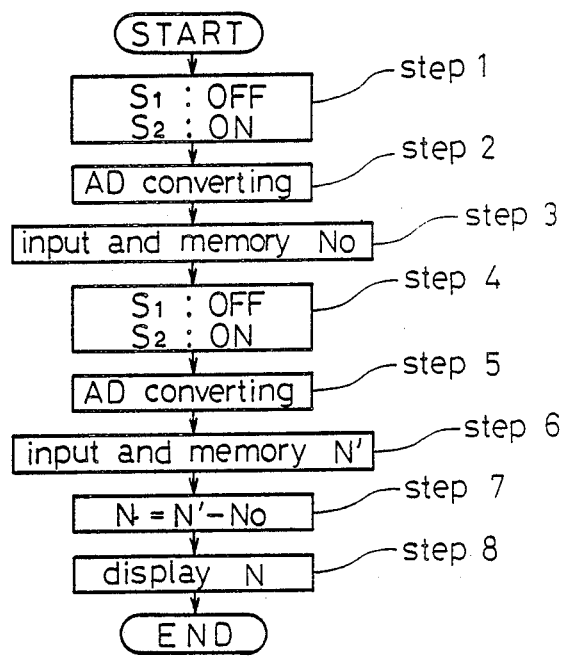

FIG. 1(a) shows an arrangement of an embodiment of a photo-electric converter according to the present invention. In FIG. 1(a), the photo-electric converter comprises a photosensitive element $SP_1$ constituted by a photoelectric device, e.g. a photodiode, or the like, an operational amplifier $IC_1$ which is a main part of a photo-electric converting circuit and an A-D converter 1 for converting an analogue signal into a digital signal, which are similar to those abovementioned, a CPU 2 having temporarily storing, calculating and controlling functions, which are mentioned below, and a display 3. A first switch $S_1$ is connected between the photosensitive element $SP_1$ and the operational amplifier $IC_1$, and a second switch $S_2$ is connected in parallel with the photosensitive element $SP_1$. The switches $S_1$, $S_2$ are controlled to be in ON and OFF states by control signals 1, 2 from the CPU respectively as described in the following.

As the switches $S_1$, $S_2$, FET, CMOS logic 4066 and the like can be used. In this embodiment, the switches $S_1$, $S_2$ are in ON state when the control signal is at HIGH level, and in OFF state when the control signal is at LOW level.

Now, the operation of the embodiment of a photo-electric converter according to the present invention will be described with reference to a flow chart of FIG. 1(b).

Firstly, in the CPU 2, the control signal 1 is set at LOW level and the control signal 2 at HIGH level (step 1). Thereby the switch $S_1$ is in OFF state and the switch $S_2$ is in ON state, and the photo-electric converting circuit section is seen as shown in FIG. 2. The output voltage $V_{out}$ at this time is as follows.

$$V_{out} = I_B \cdot Rf + V_{off}$$

This votlage is A-D converted by an A-D converter 1 to obtain a corresponding digital value $N_o$ (step 2), and this data is read and stored in the CPU (step 3).

Then, the CPU 2 sets the control signal 1 at HIGH level and the control signal 2 at LOW level (step 4). Thereby the switch $S_1$ is in ON state and switch $S_2$ is in OFF state, and the photo-electric converting circuit section is seen as shown in FIG. 3. This is a conventional photo-electric converter circuit.

The output voltage $V_{out}$ at this time is as follows.

$$V_{out} = -(I_P - I_B)R_f + V_{off}$$

This voltage is A-D converted by the A-D converter 1 to obtain a corresponding digital value $N'_o$ (step 5), and this data is read and stored in the CPU 2 (step 6).

Then a subtraction $$N = N' - N_o$$

is executed by the CPU 2, to correct an error caused by an offset voltage in the photo-electric converting circuit (step 7). Thereafter, the corrected value N is transmitted from the CPU 2 to the display 3 and displayed as a light measurement value by the display 3 (step 8).

Advantages obtained by such correction will be now described in the following.

At the abovementioned beginning of the operation, the switch $S_1$ is in OFF state and the photoelectric current $I_P$ does not flow through a feedback resistance $R_f$, while the switch $S_2$ is in ON state and the voltage $V_A$ at the anode side A of the photosensitive element $SP_1$ is OV. If the switch $S_2$ is not provided, the voltage $V_A$ is an open voltage $V_{open}$.

Consequently, since $V_{off} < < V_{open}$, by turning ON the switch $S_2$, the voltage applied between the input and the output terminals of the switch $S_1$ becomes low, thereby to decrease the leak current between the input and the output terminals.

Further, when the operation of the photo-electric converting circuit is changed from the state shown in FIG. 2 to that shown in FIG. 3, the change of the voltage $V_A$ is $$0 \rightarrow V_{off}.$$

If the switch $S_2$ is not provided, the change of the voltage $V_A$ at the time of the switch $S_1$ being turned from OFF to ON is $$V_{open} \rightarrow V_{off}.$$

The latter change of the voltage is larger than the former one.

On the other hand, since there is a capacity between the anode and the cathode of the photosensitive element $SP_1$, the change of the voltage $V_A$ takes time. Accordingly, when the switch $S_2$ is provided and therefore the change of the voltage $V_A$ is smaller, the abovementioned time, namely, the time required for the stabilization of the circuit is shorter and a quicker response can be obtained.

For executing the program shown in FIG. 1(b), it is necessary to use a CPU 2 having two registers, but a CPU 2 having only a single register can be used by carrying out the following program.

In other words, the calculation of data in the CPU 2 and the input and output of the data in and from the CPU 2 are carried out by means of an accumulator in the CPU 2. Firstly, a data in the case of the switch $S_1$ being in OFF state and switch $S_2$ in ON state is inputted in the accumulator. This value is represented by ACC.

Secondly, the abovementioned value ACC is once stored in a register (the value of the register being R) (R←ACC), then the accumulator being cleared (ACC←O), thereafter the value stored in the register being subtracted from the value ACC (ACC←ACC-R), and the value obtained by the subtraction is stored in the register (R←ACC).

Thirdly, data in the case of the switch $S_1$ being in ON state and the switch $S_2$ in OFF state is inputted in the accumulator.

Forthly, the value stored in the register is added to the value of the accumulator (ACC←ACC+R).

Fifthly, the obtained value ACC of the accumulator is outputted to the display 3.

By carrying out such a program, only one register is needed in the CPU 2, in addition to an accumulator. The abovementioned second step corresponds to counting down of the A-D converted value and the forth step corresponds to counting up of that value.

Further, the arrangement of the photo-electric converter according to one the present invention is not limited to one shown in FIG. 1(a) but may be such as shown in FIG. 4. In the arrangement shown in FIG. 4, the first switch $S_1$ is provided between the cathode of the photosensitive element $SP_1$ and the GND, unlike the abovementioned embodiment. With this arrangement, similar advantages can be obtained.

In a further embodiment of a photo-electric converter according to the present invention, an up-down counter can be used. Such an up-down counter counts down based on an output obtained when the first switch $S_1$ is in OFF state and the second switch $S_2$ is in ON state, and then counts up based on an output obtained when the first switch $S_1$ is ON state and the second switch $S_2$ is in OFF state. As a result, the value of the up-down counter becomes a value obtained by correcting an offset voltage in the photo-electric converting circuit.

Now, a further embodiment of a photo-electric converter according to the present invention in which an idea of an up-down counter is used will be described in the following.

Figure 5:
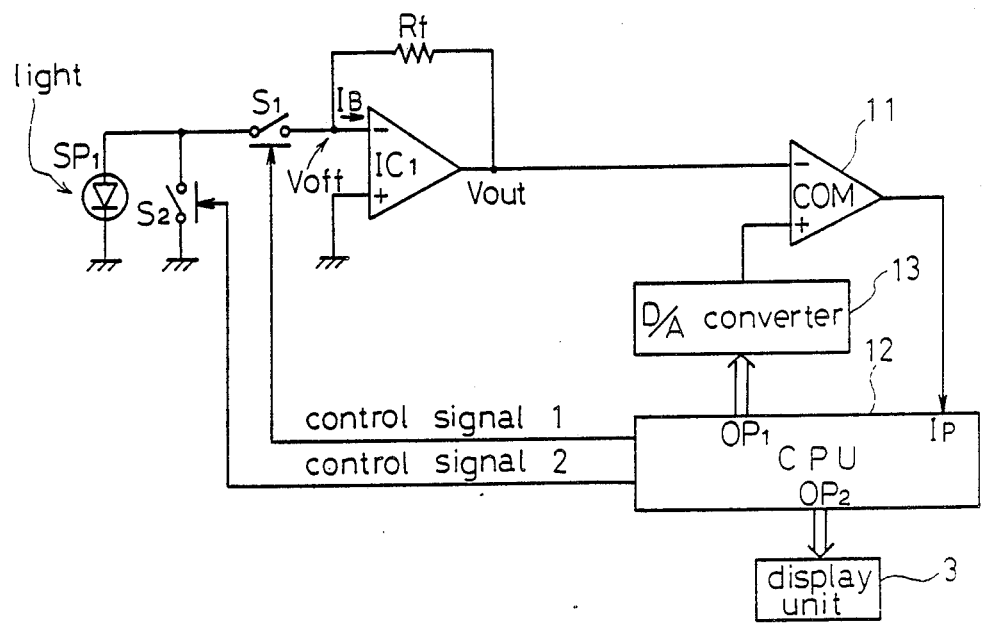
FIG. 5 is a block diagram of another embodiment of a photo-electric converter using an A-D converter of a successive conversion type according to the present invention.

An arrangement of a photo-electric converter using an A-D converter of a successive comparison type as an up-down counter is shown FIG. 5.

In FIG. 5, an A-D converter of a successive comparison type comprises a comparator 11, a CPU 12, and a D-A converter 13. An output from the D-A converter 13 is fed to a non-inverted input of the comparator 11, and an output $V_{out}$ from the operational amplifier $IC_1$ is fed to an inverted input of the comparator 11.

Figure 6:
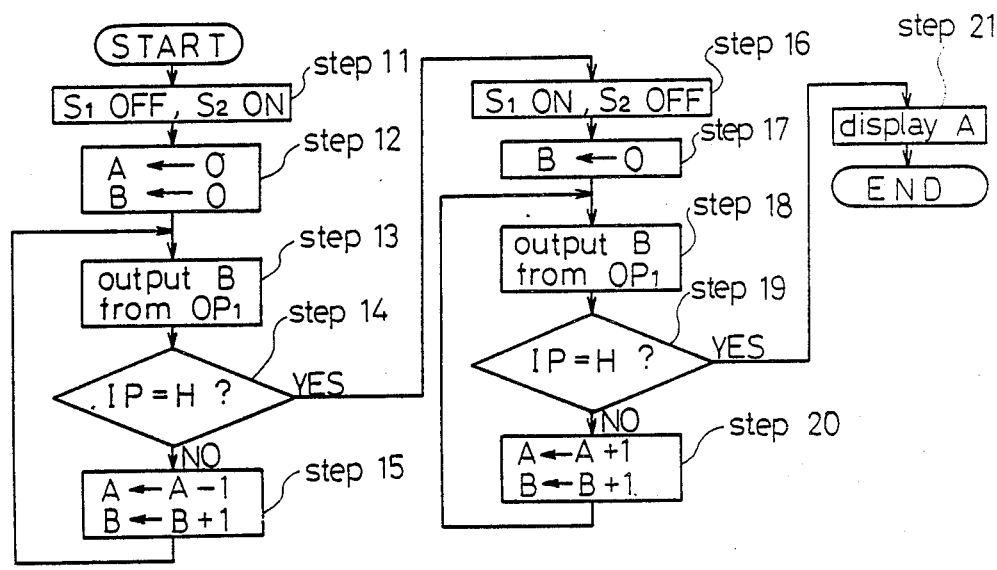
FIG. 6 is a flow chart showing the operation of the photo-electric converter of FIG. 5.

In this embodiment, the correction of an offset voltage can be achieved by carrying out a program shown in a flow chart of FIG. 6.

In other words, the switch $S_1$ is turned OFF and the switch $S_2$ ON by control signals 1, 2 of the CPU 12 (step 11), and registers A, B in the CPU 12 are cleared (step 12). Then a value of the register B is outputted from a terminal $OP_1$ to the D-A converter 13 (step 13). An output of the comparator 11 is inputted in a terminal IP of the CPU 12. In CPU 12, it is judged whether the inputted value is at HIGH level or not (step 14), and if it is not at HIGH level, 1 is subtracted from the value of the register A and 1 is added to the value of the register B (step 15). Then the program returns to step 13. These steps 13 to 15 are repeated.

When the input of the terminal IP turns to HIGH level, the switch $S_1$ is turned ON and the switch $S_2$ OFF (step 16). The register B is cleared (step 17) and the value of the register B is outputted from the terminal $OP_1$ (step 18). Then, it is judged whether the input of the terminal IP is at HIGH level or not (step 19), and if it is not at HIGH level, 1 is added to each of the values of the registers A, B (step 20). The program returns to step 18. These steps 18 to 20 are then repeated.

When the input of the terminal IP turns to HIGH level, the value of the register A is outputted from a terminal $OP_2$ of the CPU 12 to be displayed by the display 3 (step 21). The abovementioned steps 18 to 20 correspond to counting up.

Figure 7:
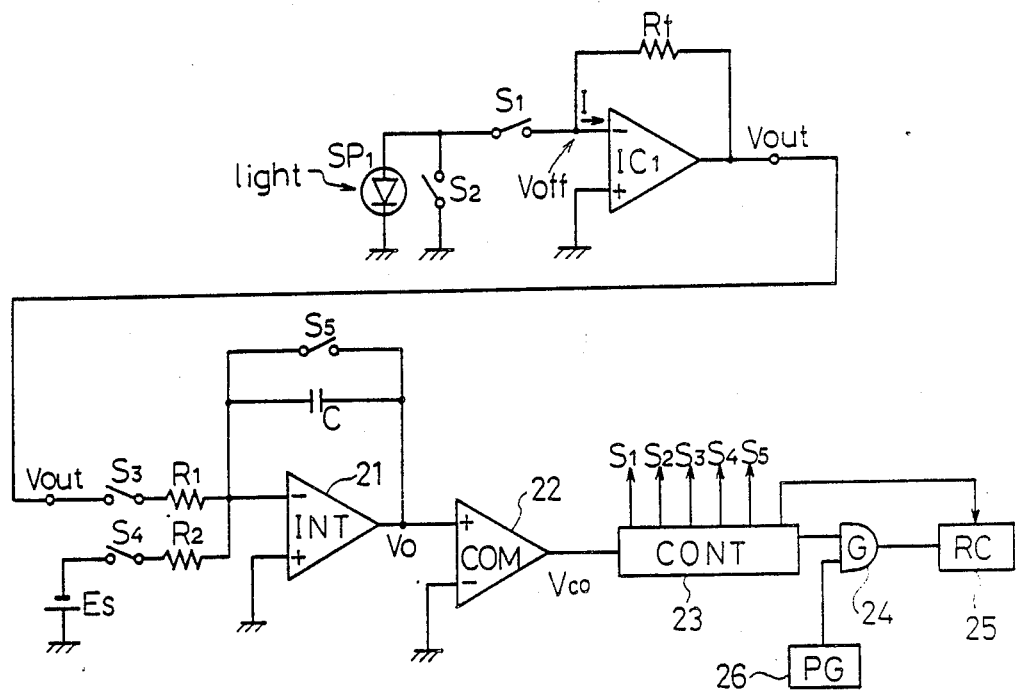
FIG. 7 is a block diagram of a further embodiment of a photo-electric converter using an A-D converter of an integration type according to the present invention.

Now, an arrangement of a further embodiment of a photo-electric converter according to the present invention in which an A-D converter of an integration type is used is shown in FIG. 7.

In FIG. 7, an A-D converter of an integration type comprises an integration amplifier 21, resistances $R_1$, $R_2$ and a capacitor C, and a switch $S_5$ is connected in parallel with the capacitor C.

An output $V_{out}$ from an operational amplifier $IC_1$ is fed through a switch $S_3$ and a resistance $R_1$ to an inverted input terminal of the integration amplifier 21 and a reference electric source $E_s$ is fed through a switch $S_4$ and a resistance $R_2$ thereto.

Further, in this embodiment, a comparator 22 to be fed with an output $V_o$ from the integration amplifier 21, a control circuit 23 to be fed with an output $V_{co}$ from the comparator 22, a gate circuit (G) 24 of which the opening and closing operation is controlled by the control circuit 23, a reversible counter (RC) 25 of which the counting condition is controlled by the control circuit 23, and a count signal generator (PG) 26 which generates pulses of a constant frequency. The abovementioned control circuit 23 also controls the operation of the switches $S_1$ to $S_5$.

The operation of the abovementioned arrangement will be now described in the following.

Figure 8:
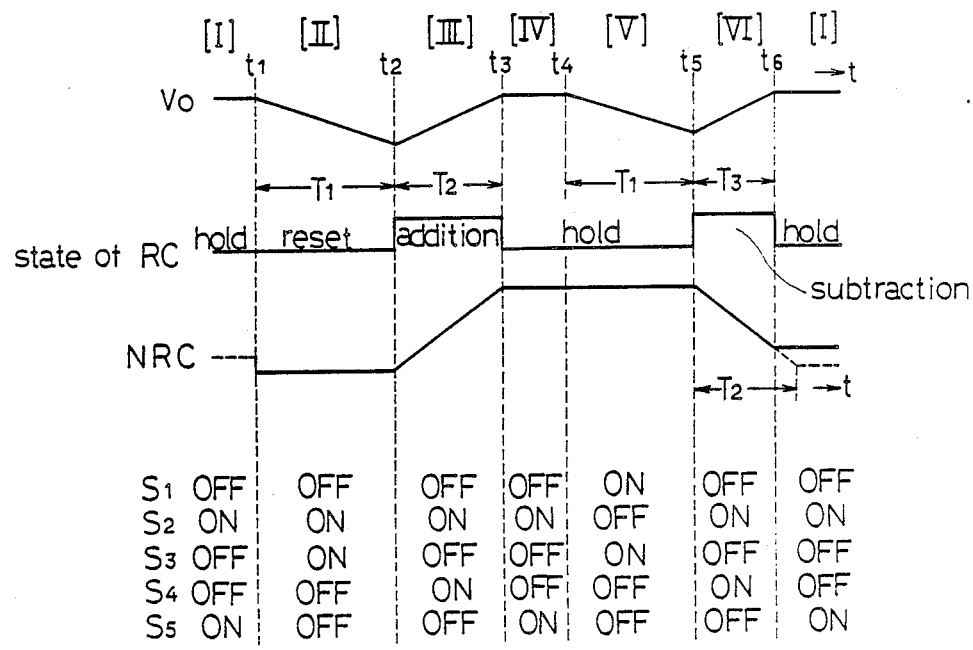
FIG. 8 is a time chart showing the operation of the photo-electric converter of FIG. 7.
Figure 9:
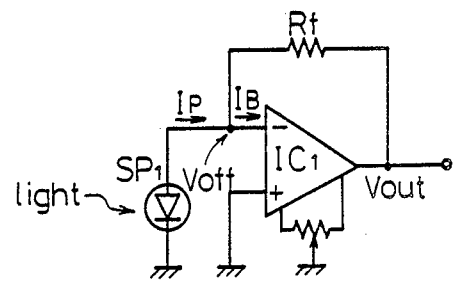
FIG. 9 is a circuit diagram of a conventional photo-electric converting circuit section.
Figure 10:
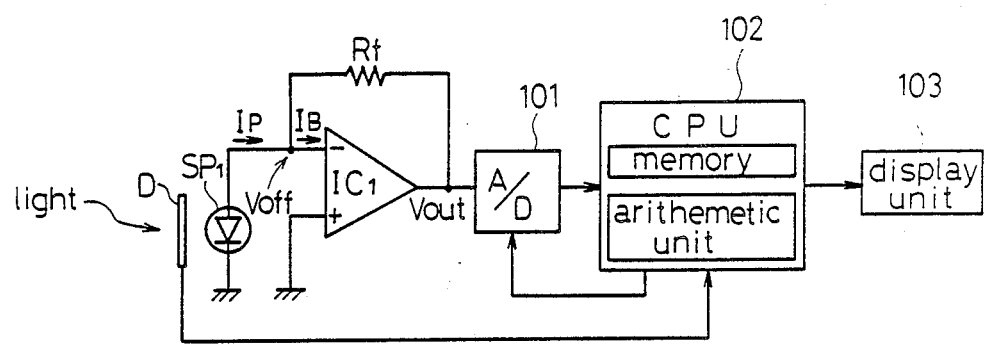
FIGS. 10 and 11 are diagrams showing arrangements for correcting an error caused by an offset voltage in conventional photo-electric converters respectively.
Figure 11:
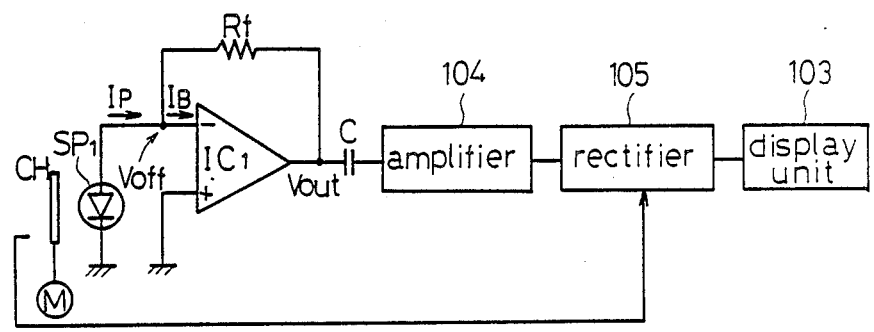

In FIG. 8, the output $V_o$ of the integration amplifier 21, the state of the reversible counter (RC) 25, the content NRC of the reversible counter (RC) 25, and ON and OFF states of the switches $S_1$ to $S_5$ are shown in relation to the time. On an axis of time, there are a waiting time I, a first charge time II, a first discharge time III, a suspension time IV, a second charge time V, and a second discharge time VI in continuation.

The arrangement and operation of the abovementioned A-D converter of an integration type are not an essential part of the present invention and therfore a detailed description thereof is omitted here. However, the content NRC of the reversible counter (RC) 25 at time t6 has no relation to an offset voltage in the photo-electric converting circuit but is proportional to the output value of the photosensitive element $SP_1$.

While the embodiments of the present invention, as herein disclosed, constitute a preferred form, it is to be understood that other forms might be adopted.

What is claimed is:

1. A photo-electric converter having an offset voltage correcting function, comprising:
   (a) a photosensitive means;
   (b) means for outputting a signal corresponding to an output of said photosensitive means;
   (c) a first switching means provided between said photosensitive means and said outputting means;
   (d) a second switching means connected in parallel with said photosensitive means;
   (e) means for analog-to-digital (A-D) conversion of a signal from said outputting means;
   (f) means for controlling ON and OFF states of said first and second switching means;
   (g) means for storing an output data from said A-D converting means when said first switching means is in OFF state and said second switching means is in ON state; and
   (h) means for calculating a difference between the output data from said A-D converting means when said first switching means is in ON state and said second switching means is in OFF state and the data stored in said storing means.

2. A photo-electric converter as claimed in claim 1, wherein said first and second switching means are semiconductor switching elements.

3. A photo-electric converter as claimed in claim 2, wherein said first and second switching means are field effect transistors.

4. A photo-electric converter as claimed in claim 2, wherein said first and second switching means are complementary metal-oxide-semiconductor logic circuits.

5. A photo-electric converter as claimed in claim 1, wherein said first switching means is connected through an earth line to said outputting means.

6. A photo-electric converter as claimed in claim 1, further comprising means for displaying a result of the calculation by said calculating means.

7. A photo-electric converter as claimed in claim 1, wherein said photosensitive means is a photoelectric device.

8. A photo-electric converter having an offset voltage correcting function, comprising:
   (a) a photosensitive means;
   (b) means for outputting a signal corresponding to an output of said photosensitive means;
   (c) a first switching means provided between said photosensitive means and said outputting means;
   (d) a second switching means connected in parallel with said photosensitive means;
   (e) means for controlling ON and OFF states of said first and second switching means; and
   (f) an up-down counter for counting down a value corresponding to a signal from said outputting means when said first switching means is in OFF state and said second switching means is in ON state, and counting up a value corresponding to a signal from the same means when said first switching means is in ON state and said second switching means is in OFF state.

9. A photo-electric converter as claimed in claim 8, wherein said first and second switching means are semiconductor switching elements.

10. A photo-electric converter as claimed in claim 9, wherein said first and second switching means are field effect transistors.

11. A photo-electric converter as claimed in claim 9, wherein said first and second switching means are complementary metal-oxide-semiconductor logic circuits.

12. A photo-electric converter as claimed in claim 8, wherein said first switching means is connected through an earth line to said outputting means.

13. A photo-electric converter as claimed in claim 8, further comprising means for displaying a count value of said up-down counter.

14. A photo-electric converter as claimed in claim 8, wherein said photosensitive means is photoelectric device.

15. A converter having an offset voltage correcting function, comprising:
   (a) a sensor;
   (b) means for outputting a signal corresponding to an output of said sensor;
   (c) a first switching means provided between said sensor and said outputting means;
   (d) a second switching means connected in parallel with said sensor;
   (e) means for analog-to-digital (A-D) converting a signal from said outputting means;
   (f) means for controlling ON and OFF states of said first and second switching means;
   (g) means for storing an output data from said A-D converting means when said first switching means is in OFF state and said second switching means is in ON state; and
   (h) means for calculating a difference between the output data from said A-D converting means when said first switching means is in ON state and said second switching means is in OFF state and the data stored in said storing means.

16. A passive photoelectric converter having an offset voltage correction function without the necessity of moving parts, comprising:
   a photosensitive means responsive to incident light for producing an output electrical signal;
   means for providing a corresponding output of the signal;
   means for electrically interconnecting the photosensitive means to the output means including a first switch member;
   means for electrically connecting the photo-sensitive means to ground, including a second switch member;
   means for controlling the operative state of the respective switch members, and
   means for processing the output of the providing means with each of the respective switch members alternatively open and closed relative to each other to provide a correction of the offset voltage that can influence the production of an output signal representative of the actual incidence of light.

* * * * *